United States Patent [19]
Hennig

[11] Patent Number: 5,955,883
[45] Date of Patent: Sep. 21, 1999

[54] METHOD OF LOCALIZED NMR SPECTROSCOPY FOR THE MEASURMENT OF OVERLAPPING SIGNAL FROM COUPLED SPIN SYSTEMS

[76] Inventor: Jürgen Hennig, Johann-von-Weerth-Str. 12, D-79100 Freiburg, Germany

[21] Appl. No.: 08/882,307

[22] Filed: Jun. 25, 1997

[30] Foreign Application Priority Data

Jun. 29, 1996 [DE] Germany .............. 196 26 255

[51] Int. Cl.[6] ..................................... G01V 3/00
[52] U.S. Cl. ............................... 324/307; 324/309
[58] Field of Search .................. 324/309, 306, 324/307, 300, 314, 312

[56] References Cited

U.S. PATENT DOCUMENTS 5,280,244 1/1994 Hinks ........................... 324/306

OTHER PUBLICATIONS

Catherine Westbrook and Carolyn Kaut, MRI in Practice. London: Blackwell Science Ltd., 1993, 1998.

*Primary Examiner*—Louis Arana

*Attorney, Agent, or Firm*—Paul Vincent

[57] ABSTRACT

A method for localized NMR spectroscopy having a sequence of radio frequency (RF) pulses for excitation and refocussing of spins in metabolites under investigation in an investigation volume, wherein the excitation is effected through an RF pulse of narrow bandwidth in the presence of a slice selection gradient, as well as, if required, an additional limitation of the investigation volume through utilization of refocussing pulses of narrow bandwidth in the presence of mutually orthogonal slice selection gradients, is characterized in that a read-out time te desired for signal production comprises an n-fold repetition of a partial sequence of RF pulses and, if required, gradient switchings at a time separation tcp2 with respect to each other, wherein a refocussing of the spins is effected within each of these refocussing time intervals using a refocussing pulse. In this fashion, loss of useful signal due to background is largely avoided so that the full intensity of multiplet signals can be observed with echo times of 20–30 ms in proton spectra with the wide signals of rapidly decaying substances having died off.

5 Claims, 7 Drawing Sheets

METHOD OF LOCALIZED NMR SPECTROSCOPY FOR THE MEASUREMENT OF OVERLAPPING SIGNAL FROM COUPLED SPIN SYSTEMS

This application is based on German Patent Application No. 196 26 255.0 filed on Jun. 29, 1996 the contents of which is hereby incorporated by reference.

BACKGROUND OF THE INVENTION

The invention concerns a method of localized MR spectroscopy having a sequence of radio frequency (RF) pulses for the excitation and refocussing of spins of metabolites which are to be investigated within an investigation volume, wherein the excitation is effected by means of an RF pulse of narrow bandwidth in the presence of a slice selection gradient as well as, if appropriate, an additional limitation of the investigation volume through use of refocussing pulses of narrow bandwidth in the presence of mutually orthogonal slice selection gradients.

A method of this type is known in the art from NMR in Biomedicine, Vol. 2, No. 5/6, 1989, pages 216–224.

Localized NMR spectroscopy is an important method for diagnosis, monitoring and research of various diseases. The target volume is localized in the conventional methods through the application of so-called slice-selection pulses. Thereby, in general, one pulse effects a selection in one spatial direction so that a sequence of three such pulses, in the presence of mutually orthogonal gradients, is utilized to localize a three-dimensional target volume. Depending on the type of signals produced, this corresponds to so-called STEAM (stimulated echo) or PRESS (spin echo) selection methods. An additional separation of the signal within a selected volume is usually achieved through the application of phase encoding gradients. These methods are known in the art as chemical shift imaging (CSI).

These localization methods all have the problem that execution of the required method steps leads to a time delay te between signal excitation and detection. During this time, decay of the signal to be observed occurs due to the relaxation time T2 (in case of STEAM also T1). This effect is e.g. rather small for the case of proton spectroscopy at easily achievable read-out times of te=20–30 ms, since the relaxation times of the conventionally observed metabolites lie in the range of several hundred milliseconds and therefore only a small weakening of the signal occurs.

The signal losses associated with signals of coupled substances are much more serious. In j-coupled spin systems the individually occurring multiplet signals are subject to differing coupling constant dependent dephasing. When such multiplet signals overlap, this dephasing leads to a substantial loss in the signal intensity to be observed. One can show that this signal loss e.g. for the observation of the in vivo signals of glutamate/glutamine in the proton spectrum, assumes a value of 50% for an echo time of 30 ms.

With new full body MR apparatus, shorter echo times can be realized. However, in addition to the desired metabolite signals, very wide additional signals from substances having short relaxation times in the range 1–20 ms appear in the proton spectrum. Same lead to a wide overlapping background signal which makes determination of the intensity of the desired signals extremely difficult.

It is therefore the purpose of the invention to avoid this signal loss to facilitate observation of the full intensity of the multiplet signal in proton spectra with echo times of 20–30 ms by means of which the broad signals of rapidly decaying substances have died off.

SUMMARY OF THE INVENTION

This purpose is achieved in accordance with the invention in a manner which is as surprisingly simple as it is effective in that the read-out time te desired for the production of signals comprises an n-fold repetition of a partial sequence of RF pulses and, if desired, gradient switchings at a time separation $tcp_2$ with respect to each other, wherein a refocussing of the spins is effected within each of these refocussing intervals using a refocussing pulse.

The method in accordance with the invention is based on the dependence of the modulation of the signal amplitude of coupled systems on the echo interval tcp of a refocussing period in a spin echo sequence. A quantum mechanical description therefor has been published by Allerhand 1966 (A. Allerhand, J.Chem. Phys. 44,1 (1996)). This author shows that the signal amplitude, in the simplest case of an AB system (Spin 1/2), is modulated with the frequency J/2, wherein J is the coupling constant. The modulation amplitude depends on J as well as on the difference of the chemical shift δ between the coupled signals. One can show (see e.g. equation 58a in Allerhand) that the modulation amplitude vanishes if the following conditions are met:

$$tcp\sqrt{\delta^2 + J^2} \leq 1. \tag{1}$$

For typical values of δ=100 1/s and J=10 1/s, tcp should be smaller than 10 ms, wherein the value to be chosen for a particular experiment depends strongly on the nature of the signals to be observed.

A variation of the method in accordance with the invention is particularly preferred with which the time interval occurring between excitation and the first refocussing pulse within the partial sequence of the refocussing interval as well as between the last refocussing pulse and the subsequent signal maximum are chosen to satisfy the requirements for generation of a CPMG refocussing sequence. In this fashion, the NMR measurement is more stable with respect to artifacts from inhomogeneities in the static magnetic field.

In an additional advantageous variation of the method in accordance with the invention, in addition to the slice selection gradient, additional gradient pulses are utilized which suppress signals outside of the excited voxel without influencing the signal from the voxel. In this manner, improved correlation of the observed signal to the investigation measuring volume is achieved.

Alternatively, a method variation is possible with which the flip angles of both RF pulses directly preceding signal read-out are chosen in such a manner that signal read-out is effected in the manner of a stimulated echo, wherein additional gradient pulses are introduced for additional selection of the stimulated echo in the time interval between these RF pulses which do not influence the formation of the stimulated echo, but do influence all other possible occurring signals.

The production of a stimulated echo allows for improved suppression of artifacts in an additional time interval tm.

An additional variation of the method in accordance with the invention provides for additional separation of the signal in the chosen voxel in correspondence to the method of Chemical Shift Imaging by application of phase encoding gradients in at least one direction in the time interval between excitation and signal read-out.

One thereby obtains information concerning a plurality of voxels leading to better spatial resolution.

Additional advantages of the invention can be derived from the description and the drawing. The above-mentioned features and those to be further described below can be utilized in accordance with the invention individually or collectively in arbitrary combination. The embodiments shown and described are not to be considered as exhaustive enumeration, rather have exemplary character only for illustration of the invention. The invention is illustrated in the drawing and will be more closely described with reference to the embodiments.

DESCRIPTION OF THE PREFERRED EMBODIMENT

Figure 1:
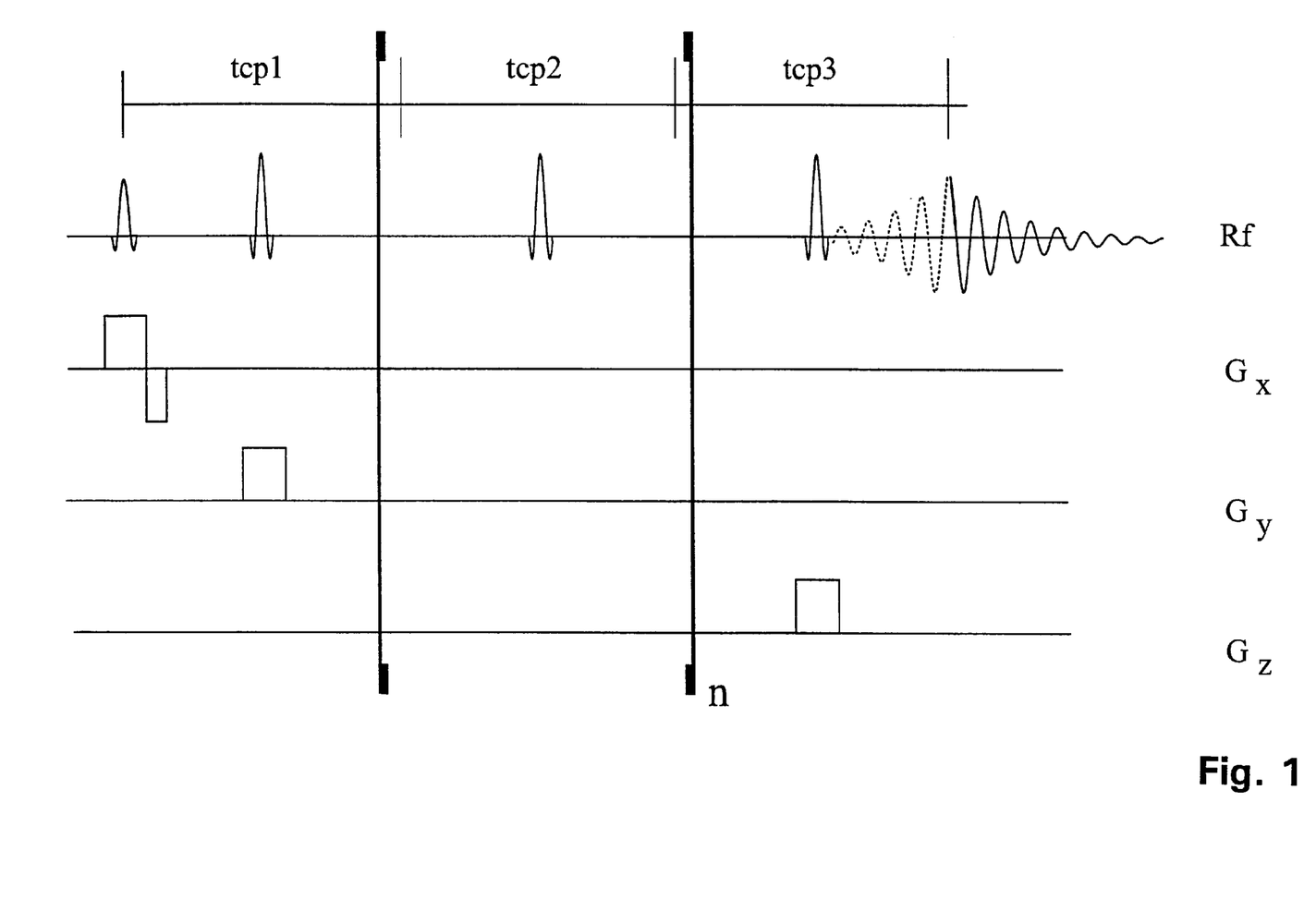
FIG. 1 shows a time diagram of the basic sequence of the method in accordance with the invention with the associated RF pulses (Rf) and gradient switchings ($G_x$, $G_y$ and $G_z$)

FIG. 1 shows the basic sequence of the method in accordance with the invention as compared to a PRESS volume selection experiment. Hereby, Rf designates the radio frequency pulse as well as the signal produced thereby. Frequently, only the decaying half (solid lines) of the spin echo signal is acquired (so-called pseudo FID (free induction decay)) and the rising portion (dotted line) is neglected. $G_x$, $G_y$ and $G_z$ designate the switchable magnet field gradients. The refocussing loop indicated in square brackets in the time interval tcp2 is repeated n times so that a signal read-out time of te=tcp1+n×tcp2+tcp3 results.

Correlation of the gradients $G_x$, $G_y$ and $G_z$ with the radio frequency pulses shown is not necessary. A necessary and sufficient condition is that at least three of the n+3 radio frequency pulses is each associated with one (and only one) of the three gradients. In this manner, the radio frequency pulses within the n-fold repetition loop indicated by brackets can be associated with a selection gradient in one of the three directions, wherein the association in the repeated cycle can also be permuted among the three spatial directions. In contrast to a conventional PRESS experiment, the method hereby shown is defined such that achievement of a particular echo time is not effected through variation of time interval between the three RF pulses necessary for volume selection, rather by means of an n-fold repetition of a refocussing interval having a refocussing time tcp2 which satisfies the requirements of equation (1) above and which is as short as possible.

Figure 2:
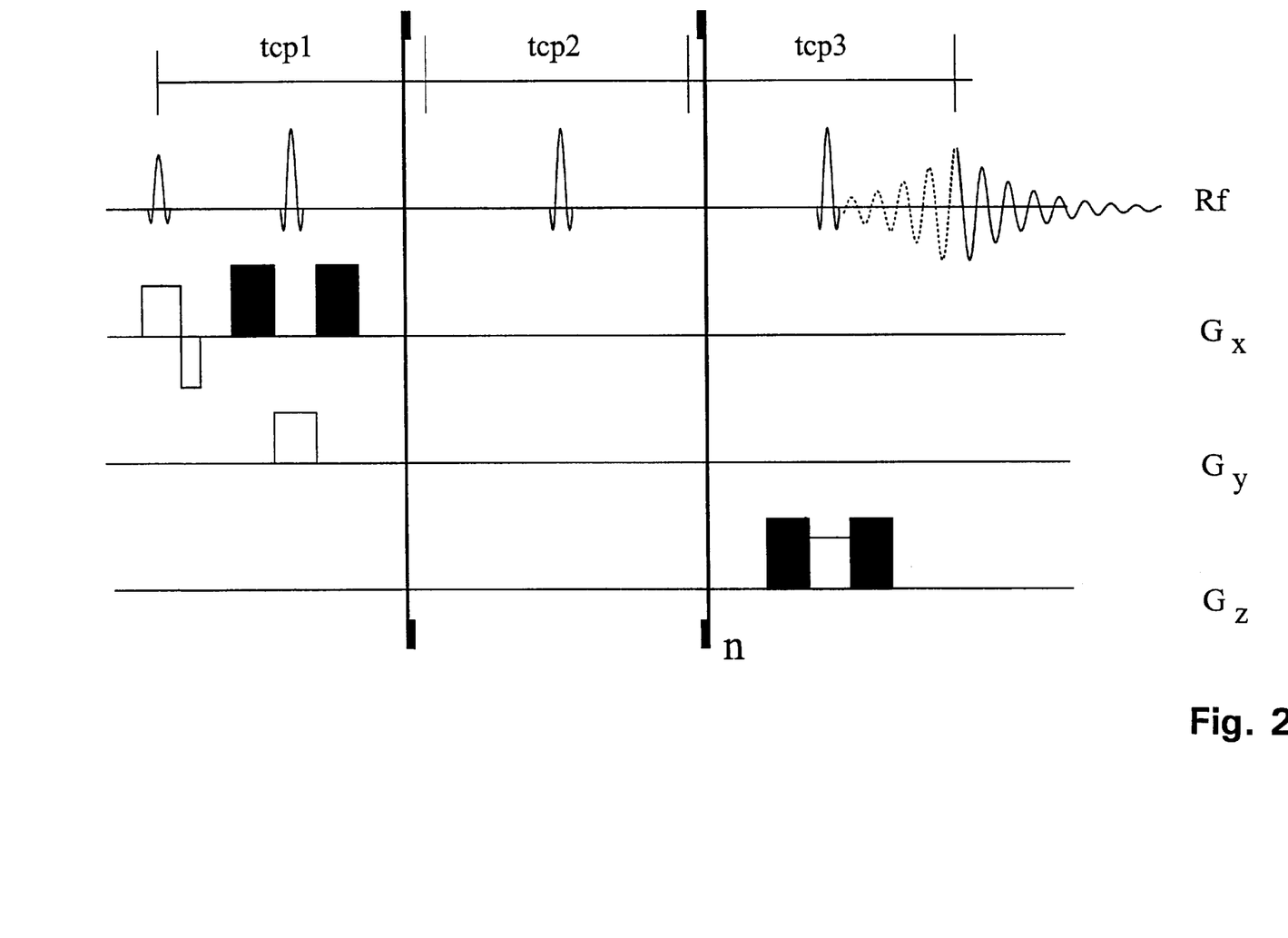
FIG. 2 shows an improvement of the basic sequence in accordance with FIG. 1 through application of spoiler gradients.

Since undesirable signals are created through the action of only one of the utilized radio frequency pulses on a corresponding slice in the investigation volume or through the effect of a pair of RF pulses on one parallelogram-shaped volume in the intersection volume between two slices, it is in general advantageous to utilize additional so-called spoiler gradients which lead to a refocussing of only the signals of the target volume with simultaneous dephasing of the undesired signals. One way of doing this is shown in FIG. 2, where the utilized spoiler gradients are shown in black in the time intervals tcp1 and tcp3.

It is in general advantageous when tcp1=tcp2=tcp3. In this case, the pulse sequence corresponds to a Carr-Purcell-Meiboom Gill (CPMG) sequence. An advantageous implementation of this sequence thereby utilizes gradients which are switched within the multi-echo loop in accordance with FIG. 1 in such a fashion that the dephasing of the spins in the target volume directly before execution of the refocussing pulse is the same in each case. A sequence of this type is known and described in the art for imaging in the presence of one-dimensional slice selection and designated the RARE method (see J. Hennig, J.Mag.Res.78, 397–407 (1988)).

Figure 3:
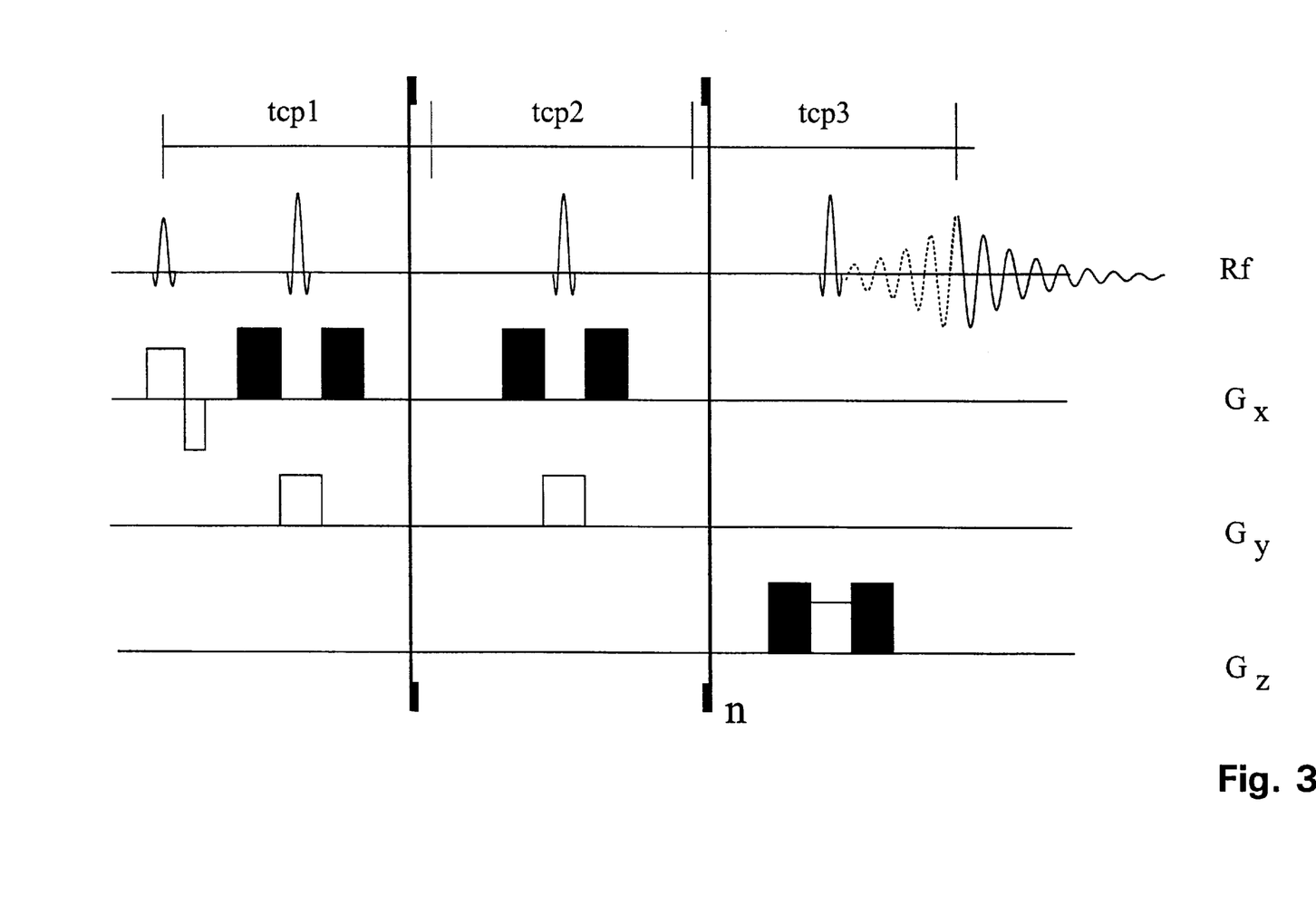
FIG. 3 shows an improvement of the sequence in accordance with FIG. 2 using the pulse sequence of a CPMG selection sequence.

A possible realization of such a CPMG selection sequence for volume-selective spectroscopy is shown in FIG. 3. Other possibilities for the application of gradient switching steps which likewise lead to formation of the desired signals with simultaneous suppression of undesired signals can be easily derived by one of average skill in the art from the basic sequence of FIG. 1.

Figure 4:
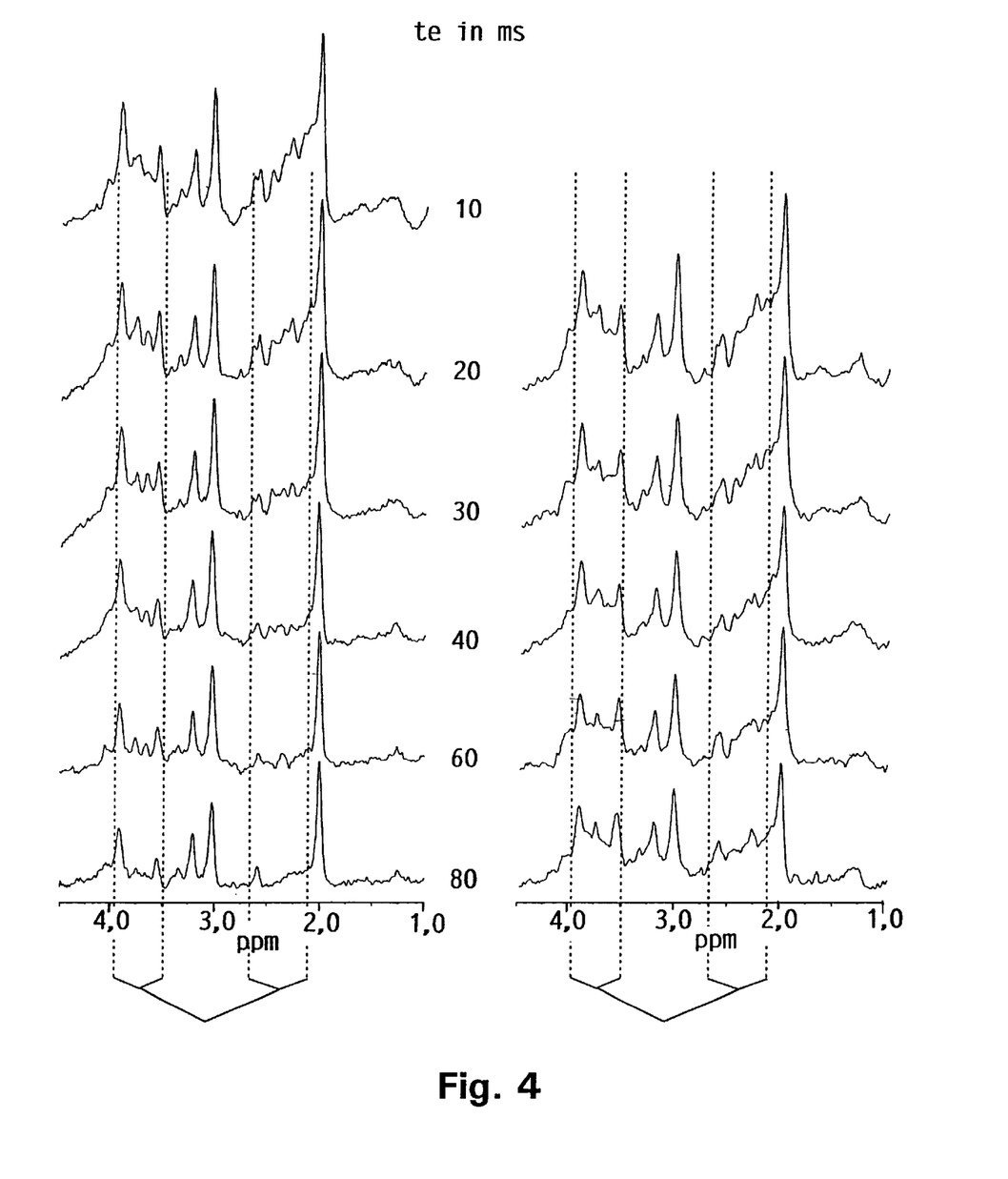
FIG. 4 shows a comparison between a conventional PRESS sequence (left side of the Figure), with spectra under application of the method in accordance with the invention of FIG. 3 (right side of the Figure)

The signal improvement effected by a sequence corresponding to FIG. 3 in the signals of coupled multiplets relative to the conventional PRESS sequence is clearly shown in FIG. 4 in comparative measurements based on in vivo proton spectra in a brain sample (Voxel size 2×2×2 $cm^3$, 2T whole body system (Bruker S 200 Avance), 64 averagings). One thereby sees that the fast signal decay of the glutamate and glutamine signals in the range of 2–2.5 ppm and 3.5–3.8 ppm is effectively avoided. The left figure half of FIG. 4 shows results of a conventional PRESS sequence with read-out times te between 10 and 80 ms, whereas the right half of FIG. 4 shows corresponding spectra using the method of FIG. 3 in accordance with the invention. Regions of glutamate/glutamine signals are each indicated by the two dotted vertical lines.

Figure 5:
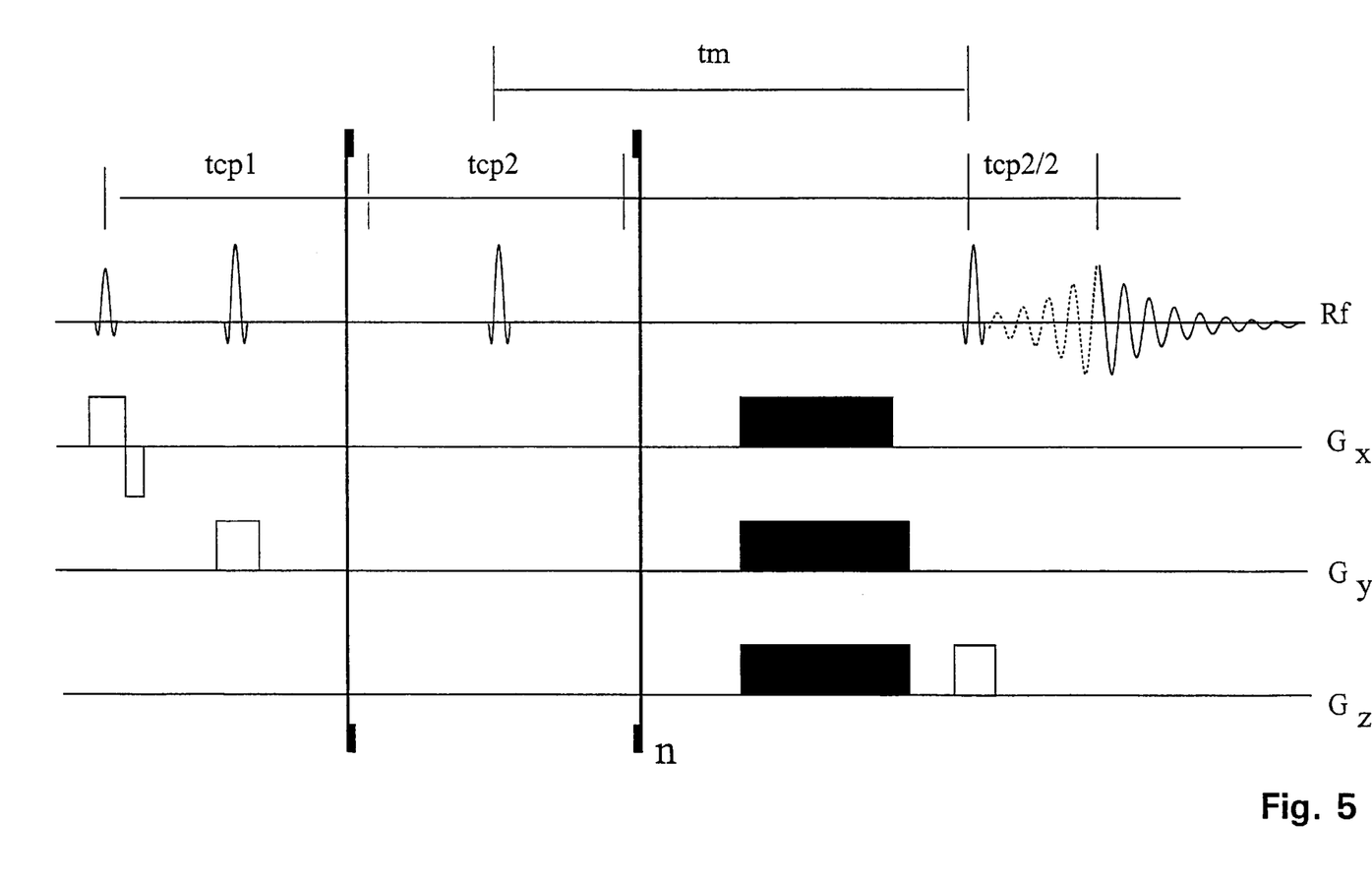
FIG. 5 shows a variation of the method in accordance with the invention with production of a stimulated echo and application of strong spoiler gradients.

It is also possible and, under certain circumstances, reasonable to carry out one of the selection steps for volume-selective signal production to effect a so-called stimulated echo. In particular, as shown in FIG. 5, when this is the last step before signal read-out, same facilitates introduction of additional, very strong spoiler gradients in a time interval tm to suppress the undesired signals. Hereby, the flip angle of the last two radio frequency pulses is set to 90 degrees in order to optimize signal intensity.

Figure 6:
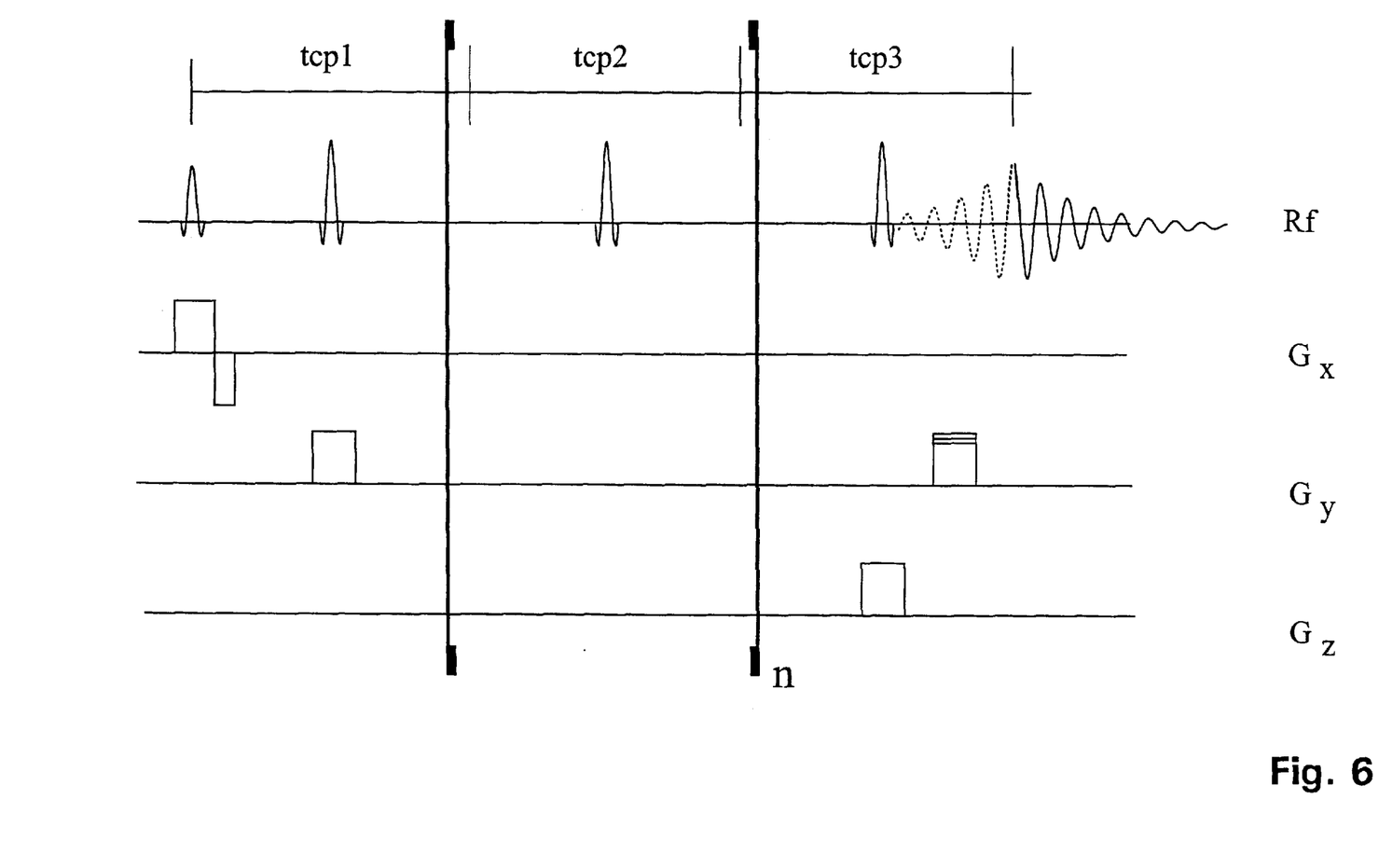
FIG. 6 shows a variation of the method in accordance with the invention with CSI phase encoding.

The method in accordance with the invention can also be easily used with the chemical shift imaging (CSI) procedure. This is shown in FIG. 6 for the case of a CSI experiment in a selected volume, wherein same is effected through variation of an additional phase encoding gradient which, in the example shown, is in the direction of the gradient $G_y$. As is known in the art, such a CSI phase encoding can also, of course, be carried out in any other arbitrary direction. Two- or three-dimensional CSI experiments can also easily be derived by one of average skill in the art from the sequence shown.

Figure 7:
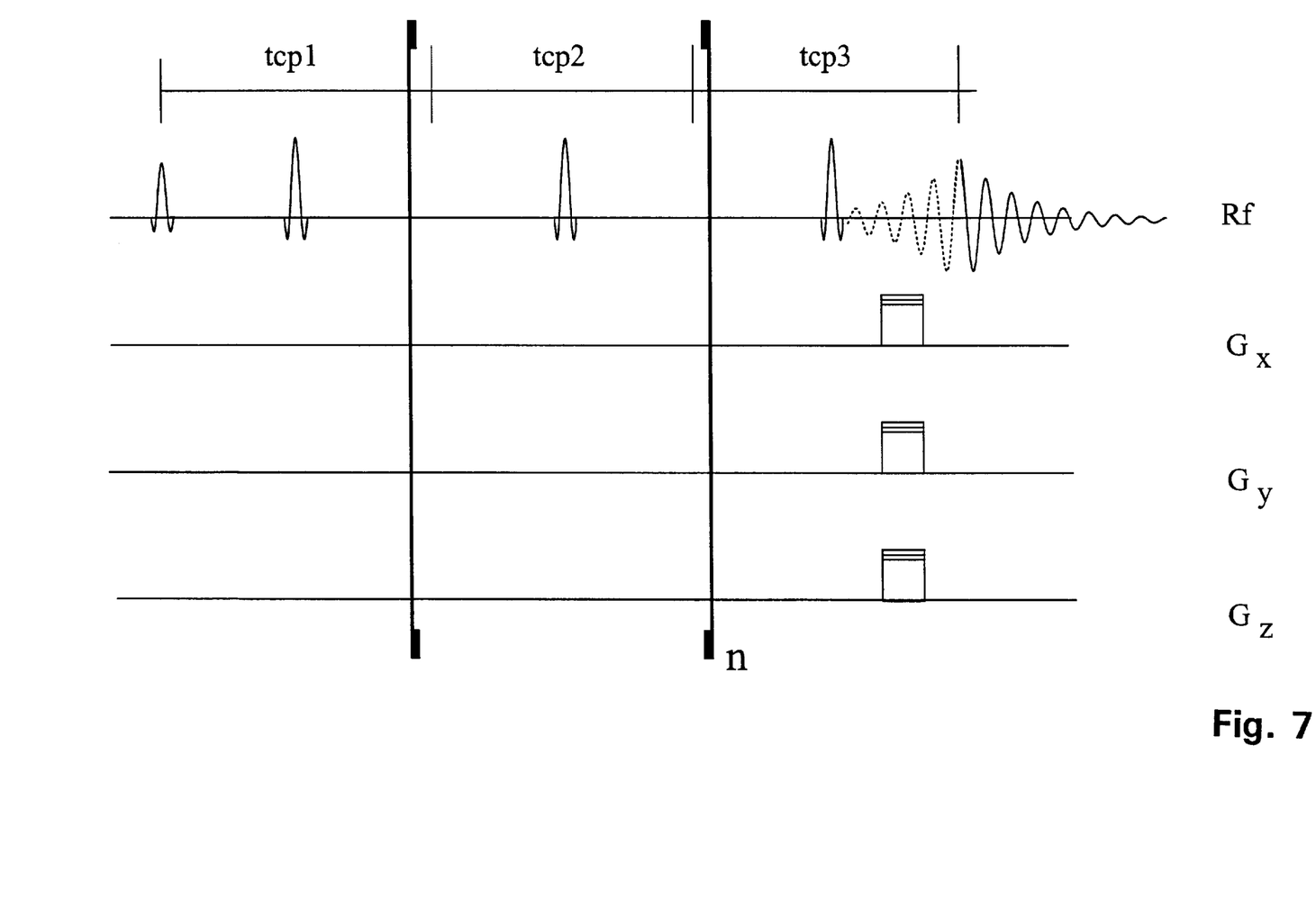
FIG. 7 shows a CSI method variation with low dimension volume selection.

Also for the case of CSI, a three-dimensional volume selection based on the additional phase encoding is neither necessary nor always reasonable. By eliminating one or more of the slice selection gradients shown in FIG. 6, one can easily perform CSI experiments with associated low-dimensional volume selection. FIG. 7 shows a possible usable sequence completely without volume selection, but with three-dimensional phase encoding.

I claim:

1. A method of localized MR spectroscopy having a sequence of radio frequency (RF) pulses to excite and refocus spins in metabolites in an investigation volume comprising:

a) irradiating, in a first time interval tcp1, a first excitation and a first refocussing pulse into the investigation volume;

b) irradiating, in a second time interval tcp2, a second refocusing pulse into the investigation volume;

c) repeating step b) at equal time separations of tcp2 n additional times;

d) irradiating in a third time interval tcp3, a third refocussing pulse into the investigation volume; and e) reading out a refocussed signal following step d), wherein read out is effected only once per sequence, at the end of the sequence, and in the absence of gradients.

2. The method of claim 1, wherein a time interval between said first excitation pulse and said second refocussing pulse of step b), and a time interval between said second refocussing pulse of step c) and said third refocussing pulse fulfil requirements of a CPMG refocussing sequence.

3. The method of claim 1, further comprising the steps of applying a slice selection gradient and applying additional gradient pulses to suppress signals outside of the investigation volume without influencing signals within the investigation volume.

4. The method of claim 1, wherein a flip angle of two RF pulses immediately preceding signal read-out is chosen to effect signal read-out as a stimulated echo and further comprising the step of applying additional spoiler gradient pulses to supress unwanted signals.

5. The method of claim 1, further comprising applying phase encoding gradients in at least one direction in a time interval between excitation and signal read-out to effect a further separation of signals in the investigation volume in accordance with a method of chemical shift imaging.

* * * * *